US008530292B2

(12) United States Patent
Morand et al.

(10) Patent No.: US 8,530,292 B2
(45) Date of Patent: Sep. 10, 2013

(54) METHOD FOR MANUFACTURING A STRAINED CHANNEL MOS TRANSISTOR

(75) Inventors: Yves Morand, Grenoble (FR); Thierry Poiroux, Voiron (FR); Jean-Charles Barbe, Izeron (FR)

(73) Assignees: STMicroelectronics (Grenoble 2) SAS, Grenoble (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 13/229,081

(22) Filed: Sep. 9, 2011

(65) Prior Publication Data

US 2012/0153394 A1 Jun. 21, 2012

(30) Foreign Application Priority Data

Sep. 13, 2010 (FR) ...................................... 10 57253

(51) Int. Cl.
*H01L 21/20* (2006.01)
(52) U.S. Cl.
USPC ........... 438/183; 257/401; 257/332; 438/589; 438/426
(58) Field of Classification Search
USPC ........................................................ 257/347
See application file for complete search history.

(56) References Cited

U.S. PATENT DOCUMENTS

| 7,972,916 | B1* | 7/2011 | Connelly et al. | 438/197 |
|---|---|---|---|---|
| 2006/0043424 | A1* | 3/2006 | Bowen et al. | 257/204 |
| 2006/0220147 | A1 | 10/2006 | Ma et al. | |
| 2007/0114632 | A1 | 5/2007 | Chidambarrao et al. | |
| 2007/0228488 | A1 | 10/2007 | Kishii et al. | |
| 2008/0105910 | A1* | 5/2008 | Matsuki | 257/295 |
| 2008/0277740 | A1 | 11/2008 | Tateshita | |
| 2009/0072371 | A1* | 3/2009 | Nishida et al. | 257/682 |
| 2010/0019322 | A1 | 1/2010 | Chen et al. | |

OTHER PUBLICATIONS

French Search Report dated Apr. 8, 2011 from corresponding French Application No. 10/57253.

* cited by examiner

*Primary Examiner* — Chuong A Luu
*Assistant Examiner* — Jaehwan Oh
(74) *Attorney, Agent, or Firm* — Wolf, Greenfield & Sacks, P.C.

(57) ABSTRACT

A method for manufacturing a strained channel MOS transistor including the steps of: forming, at the surface of a semiconductor substrate, a MOS transistor comprising source and drain regions and an insulated sacrificial gate which partly extends over insulation areas surrounding the transistor; forming a layer of a dielectric material having its upper surface level with the upper surface of the sacrificial gate; removing the sacrificial gate; etching at least an upper portion of the exposed insulation areas to form trenches therein; filling the trenches with a material capable of applying a strain to the substrate; and forming, in the space left free by the sacrificial gate, an insulated MOS transistor gate.

17 Claims, 3 Drawing Sheets

METHOD FOR MANUFACTURING A STRAINED CHANNEL MOS TRANSISTOR

CROSS REFERENCE TO RELATED APPLICATIONS

This application claims the priority benefit of French patent application number 10/57253, filed on Sep. 13, 2010, entitled METHOD FOR MANUFACTURING A STRAINED CHANNEL MOS TRANSISTOR, which is hereby incorporated by reference to the maximum extent allowable by law.

BACKGROUND OF THE INVENTION

1. Field of the Invention

The present invention relates to a method for manufacturing strained-channel MOS transistors.

2. Discussion of the Related Art

Integrated MOS transistors are formed at the surface of semiconductor substrates. They include an insulated gate formed on the surface of the substrate and source and drain regions formed in the substrate, on either side of the gate.

In a semiconductor substrate, the carriers involved in N-channel or P-channel transistors do not move at the same speed. To improve the mobility of carriers, it is known to form different channel regions according to the type of carriers used. Especially, the mobility of carriers in P-channel MOS transistors is known to be greater when the channel is made of silicon-germanium rather than of silicon. For N-channel MOS transistors, a silicon substrate is better adapted. It can thus be provided to form, on a same structure, silicon-germanium channel regions for P-channel MOS transistors and silicon channel regions for N-channel MOS transistors.

It is also known that, on a same substrate, the mobility of some carriers can be improved by local application of a strain on the channel of the concerned transistors. This is especially described in publication "Electron Mobility Model for Strained-Si Devices", by Dhar et al., TED 52 (2005).

Many methods have been provided to apply a local strain on the channel of given transistors. It has especially been provided to modify or to replace the material forming the source and drain regions so that the modified or replacement material applies a strain along the length of the transistor channel.

However, known methods are generally relatively complex to implement and necessitate a significant number of additional manufacturing steps with respect to conventional MOS transistor manufacturing methods.

SUMMARY OF THE INVENTION

An embodiment provides a relatively simple method for forming strained-channel MOS transistors, which implies but few additional steps with respect to known methods.

Another embodiment provides a method compatible with the forming of MOS transistor gates at the surface of a same substrate in different materials.

An embodiment provides a method for manufacturing a strained channel MOS transistor, comprising the steps of: (a) forming, at the surface of a semiconductor substrate, a MOS transistor comprising source and drain regions and an insulated sacrificial gate which partly extends over insulation areas surrounding the transistor; (b) forming a layer of a dielectric material having its upper surface level with the upper surface of the sacrificial gate; (c) removing the sacrificial gate; (d) etching at least an upper portion of the exposed insulation areas to form trenches therein; (e) filling the trenches with a material capable of straining the substrate; and (f) forming, in the space left free by the sacrificial gate, an insulated MOS transistor gate.

According to an embodiment, step (e) is carried out by depositing a material capable of straining the substrate over the entire structure, and by then etching the excess material located outside of the trenches.

According to an embodiment, the trenches extend all the way to the semiconductor substrate, or all the way to a semiconductor-on-insulator structure support, and the filling of the trenches at step (e) is performed by epitaxy of the material capable of applying a strain from the bottom of the trenches.

According to an embodiment, the substrate is a solid substrate.

According to an embodiment, the substrate is a substrate of semiconductor-on-insulator type.

According to an embodiment, the material capable of straining the substrate is silicon nitride, silicon-germanium, or a material having a structure capable of reflowing after an anneal.

According to an embodiment, step (f) is preceded or followed by a step of removal of the dielectric material layer.

An embodiment provides an integrated circuit comprising at least one MOS transistor formed by the above method.

The foregoing and other objects, features, and advantages will be discussed in detail in the following non-limiting description of specific embodiments in connection with the accompanying drawings.

BRIEF DESCRIPTION OF THE DRAWINGS

FIGS. 2A to 7A, respectively 2B to 7B, are cross-section views across the width of a transistor, respectively along the transistor length, illustrating results of steps of a method according to an embodiment.

For clarity, the same elements have been designated with the same reference numerals in the different drawings and, further, as usual in the representation of integrated circuits, the various drawings are not to scale.

DETAILED DESCRIPTION

Figures 1A, 1B:
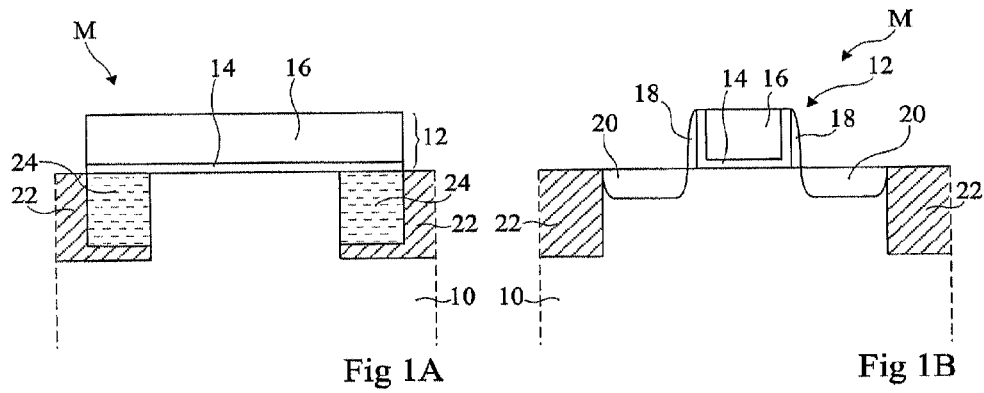
FIGS. 1A to 1C respectively are a widthwise and a lengthwise cross-section view, and a simplified top view of a MOS transistor formed by a method according to an embodiment.

In the drawings which will be described hereafter, a single MOS transistor is shown at the surface of a substrate. It should be noted that, conventionally, many MOS transistors are formed at the surface of a same substrate, for example, in association with other electronic components.

Further, in the following description, when a material applying a strain on the adjacent semiconductor substrate will be mentioned, the considered strain may be a tensile strain or a compressive strain, according to the desired application and to the desired carrier mobility.

Figure 1C:
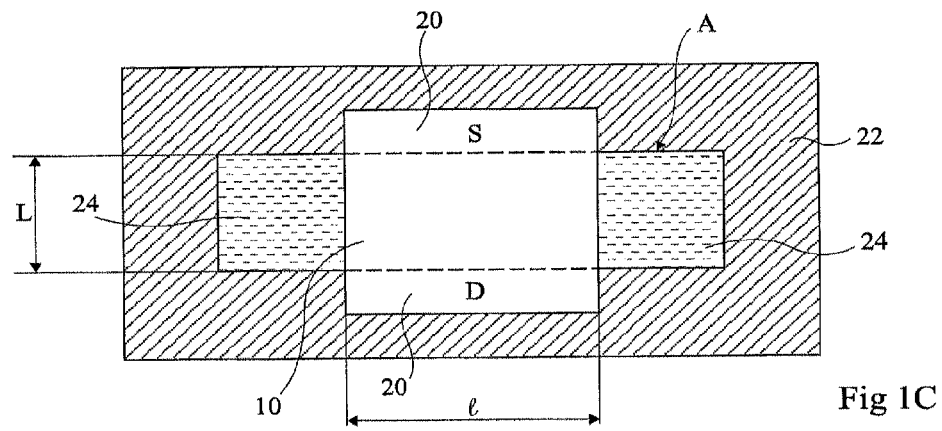

FIGS. 1A, 1B, and 1C illustrate, respectively in cross-section view along two perpendicular directions at the surface of a substrate and in simplified top view, a MOS transistor M obtained by a method according to an embodiment. The top view of FIG. 1C is simplified in that it does not show the insulated gate of the transistor. Conventionally, the channel distance between the source and drain regions is called the transistor length (channel length, L in FIG. 1C) and the dimension in a direction, at the substrate surface, perpendicular to its length is called the transistor width (l in FIG. 1C). It should be noted that, in the drawings, the length of the shown transistor is shorter than its width. The opposite is also possible.

Transistor M is formed at the surface of a semiconductor substrate 10. More specifically, transistor M is formed in an active area A formed of a portion of semiconductor substrate 10 surrounded with an insulation region 22, formed at the substrate surface. As an example, insulation regions 22 may be "STI"-type (Shallow Trench Isolation) regions. The transistor comprises, at the surface of active area A, an insulated gate 12 comprising a lower insulating layer 14 topped with a layer of a conductive material 16, for example, doped polysilicon.

Spacers 18 are formed all around insulated gate 12. Source and drain regions 20 are formed in semiconductor substrate 10, at the surface thereof, on either side of gate 12 along the length of transistor M. Insulating regions 22 are, in the shown example, in contact with source and drain regions 20.

Across the width of transistor gate 12 (FIG. 1A), on either side of insulated gate 12, insulation regions 22 which enable to insulate the different MOS transistors formed at the surface of a same substrate from one another extend. Under transistor gate 12, in contact with insulation regions 22, regions 24 of a material capable of straining the adjacent substrate are formed. Especially, material 24 enables to apply a strain on the region of substrate 10 formed under transistor gate 12, at the level of the channel of transistor M.

In the shown example, portions 24 of a material capable of straining the adjacent substrate do not extend all the way to the bottom of insulation regions 22. It should be noted that portions 24 may also extend all the way to the bottom of insulation regions 22.

The method described hereafter enables to form, on a same semiconductor substrate, MOS transistors such as that of FIGS. 1A and 1B, but also conventional MOS transistors, in which the semiconductor material forming the channel portion of the transistor is not strained. To achieve this, it will be enough for the conventional transistors to be masked on manufacturing of the strained-channel transistors. It may also be provided to foam strained-channel and unstrained-channel transistor gates in different materials, selectively etchable with respect to each other. The method described hereafter is also compatible with the forming of MOS transistor gates of different structures or materials at the surface of a same substrate.

FIGS. 2A to 7A, respectively 2B to 7B, are cross-section views across the width of a transistor, respectively along the transistor length, illustrating results of steps of a method according to an embodiment of the present invention.

Figures 2A, 2B:
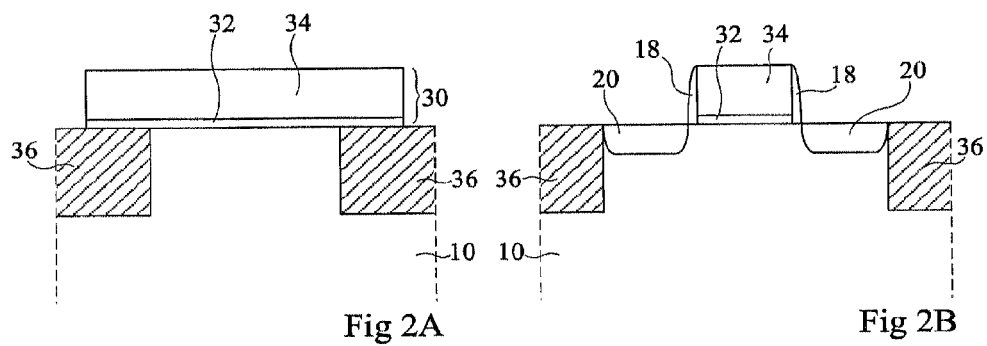

At the step illustrated in FIGS. 2A and 2B, a completed conventional MOS transistor is formed at the surface of a semiconductor substrate 10. This transistor comprises an insulated gate 30 comprising a lower insulating layer 32 and an upper layer 34 of a conductive material such as doped polysilicon. Spacers 18 are formed all around insulated gate 30. The source and drain regions are formed, on either side of spacers 18 along the transistor length, in semiconductor substrate 10, at its surface, and may be silicided.

The transistor is formed in an active area defined in substrate 10 by insulation regions 36. Thus, across the transistor width, on either side of the channel region formed under the insulated gate, insulating regions 36 extend at its surface. As an example, insulating regions 36 may be STI-type (Shallow Trench Isolation) regions, for example, made of silicon oxide. Conventionally, insulated gate 30 extends slightly at the surface of insulating regions 36.

Figure 3A:
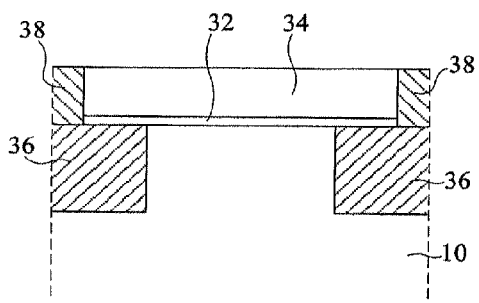
Figure 3B:
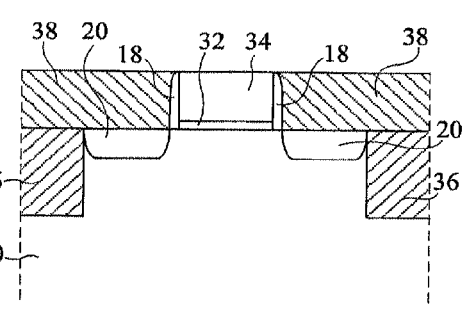

At the step illustrated in FIGS. 3A and 3B, a layer of insulating material 38, selectively etchable over the material foaming insulation regions 36, is formed on the structure to cover the entire device. The surface of insulating layer 38 is at the same level as the surface of insulated gate 30: the surface of layer 38 is flush with the surface of gate 30.

To form insulating layer 38, it is for example possible to perform a full plate deposition of an insulating material, followed by a chem.-mech. polishing (CMP) or an etching to expose the upper surface of insulated gate 30. As an example, if insulating regions 36 are made of silicon oxide, insulating layer 38 may be made of silicon nitride selectively etchable over silicon oxide. Other materials may of course be envisaged.

Figure 4A:
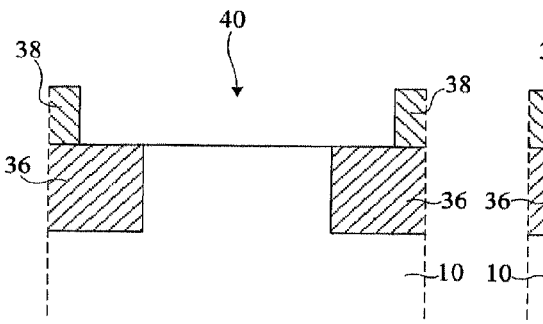
Figure 4B:
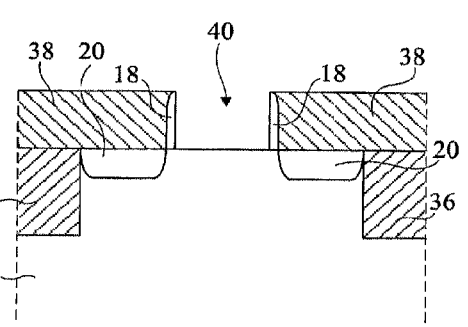

At the step illustrated in FIGS. 4A and 4B, one or several etchings have been performed to eliminate conductive material 34 and insulating material 32 of insulated gate 30. This enables to form, within dielectric material 38, a trench 40 at the location of insulated gate 30.

Figure 5A:
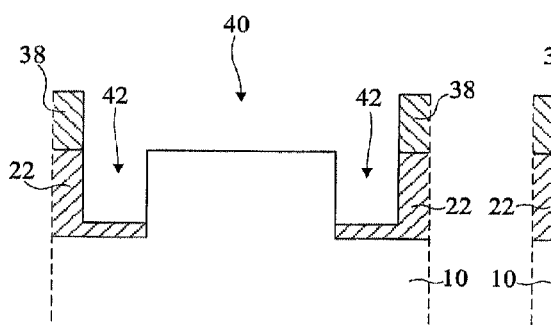
Figure 5B:
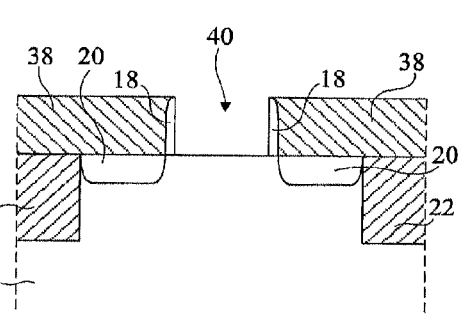

At the step illustrated in FIGS. 5A and 5B, an anisotropic or isotropic etching is performed to eliminate a portion of insulation areas 36 corresponding to the portion which is not protected by dielectric material 38. This etching provides trenches 42 in insulation regions 36. It should be noted that the etching performed to obtain the device of FIGS. 5A and 5B may be the same as that used, at the step of FIGS. 4A and 4B, to remove the insulating material from insulated gate 30, if this etching is compatible with the material of insulation regions 36.

In the example shown in FIGS. 5A and 5B, trenches 42 do not extend all the way to the bottom of insulation regions 36. It should be noted that these trenches may also extend to the bottom of insulation regions 36.

Figures 6A, 6B:
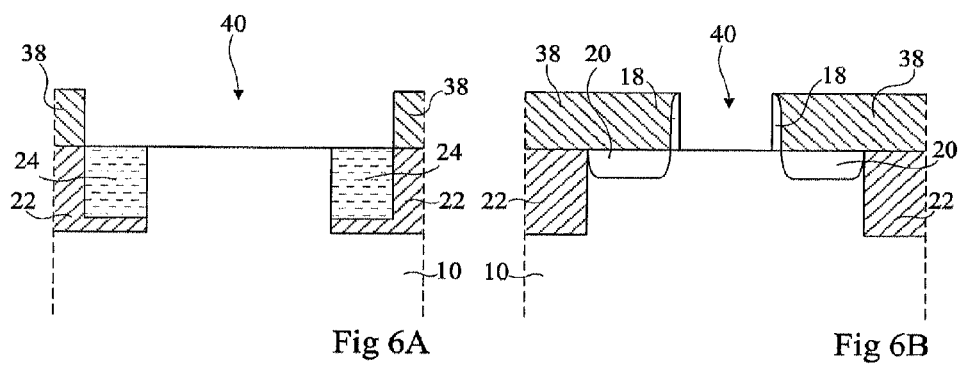

At the step illustrated in FIGS. 6A and 6B, trenches 42 have been filled with a material 24 capable of straining the adjacent substrate, and especially the channel region formed of semiconductor substrate 10 located between straining material regions 24. Material 24 may be formed in several ways. For example, it may be provided to deposit this material over the entire structure, then to etch it so that its upper surface is at the same level, or substantially at the same level, as the upper surface of substrate 10.

It may also be provided, if trenches 42 extend all the way to the bottom of insulation regions 36, to form regions 24 by performing an epitaxy of a semiconductor material capable of straining the adjacent substrate from substrate 10.

The material of regions 24 may for example be silicon-germanium (which may be undergo an epitaxy), silicon nitride ($Si_3N_4$), or any other material, for example a material having a structure capable of reflowing after the application of an anneal, for example, a boron- or phosphorus-doped oxide annealed at a temperature greater than 850° C., such as described in publication "A 3-D BPSG Flow Simulation with Temperature and Impurity Concentration Dependent Viscosity Model", by Unimoto et al., IEEE 1991.

Figures 7A, 7B:
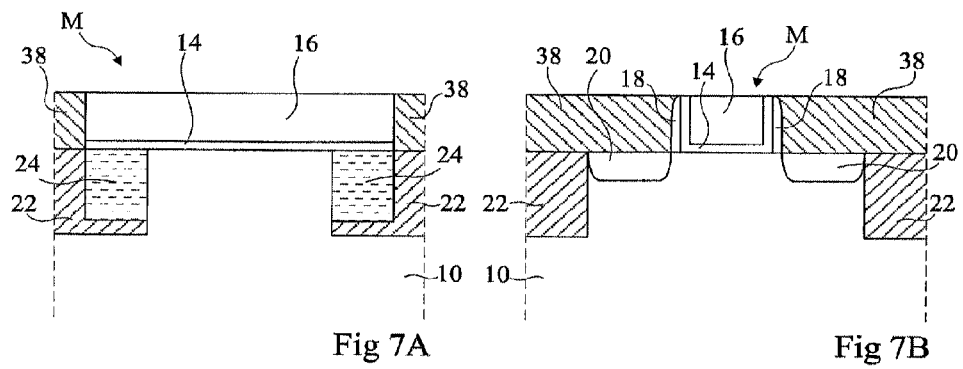

At the step illustrated in FIGS. 7A and 7B, a new insulated MOS transistor gate 12 has been formed in trench 40. Gate 12 comprises a lower insulating layer 14 having a conductive layer 16, for example, made of doped polysilicon, formed at its surface. This gate may be formed in many ways, for example, by depositing all the materials forming the gate in the form of thin layers on the contour of the structure of FIGS. 6A and 6B, and thus in trench 40, and then by planarizing the structure (case shown in FIGS. 7A and 7B). The method of etching a sacrificial gate and reforming a MOS transistor gate used herein is especially described in publication "75 nm Damascene Metal Gate and High-k Integration for Advanced CMOS Devices" by B. Guillaumot et al., IEDM 2002, pages 355-358.

A subsequent step of removal of dielectric material 38 provides the structure of MOS transistor M of FIGS. 1A and 1B. This step may be followed by a step of forming of a silicide on the source and drain areas, if necessary.

Figures 8A, 8B:
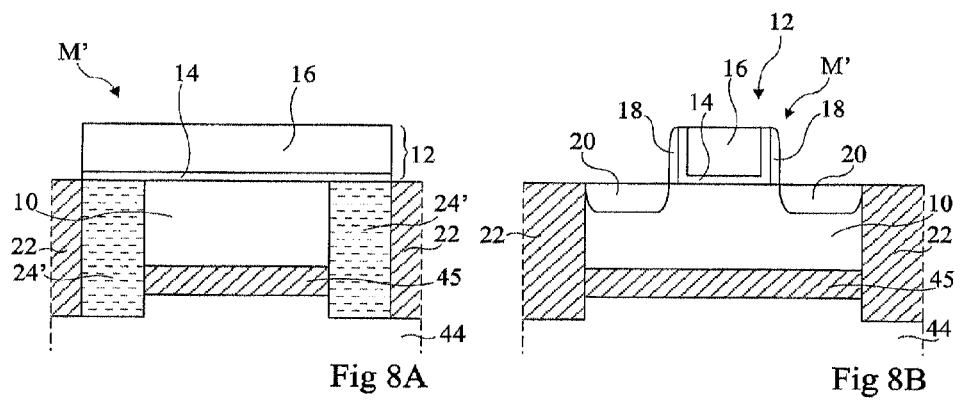
FIG. 8A, respectively 8B, is a cross-section view across the width of a MOS transistor, respectively along its length, resulting from a variation of a method according to an embodiment.

FIGS. 8A and 8B illustrate a result of a variation of the above-described method enabling to form a MOS transistor M'.

In this variation, substrate 10 is not a solid substrate, but a substrate of semiconductor-on-insulator type (SOI). In this configuration, substrate 10 is a semiconductor layer which is formed at the surface of an insulating layer 45, which itself extends on a semiconductor support 44.

Insulation regions 22 of the transistors, defining the active area of the transistor, extend in substrate 10, through insulating layer 45, and into underlying substrate 44. Regions 24' of a material capable of straining the channel of transistor M' are formed across the width of insulating material 22. Insulated gate 14-16 of transistor M' is similar to that of transistor M of FIGS. 7A and 7B.

The forming of regions 24' of a material capable of straining the channel of transistor M', through insulating layer 45, enables to form these regions 24' by performing an epitaxy from the semiconductor material of support 44.

To form the structure of FIGS. 8A and 8B, operations similar to those described in relation with FIGS. 2A to 7A and 2B to 7B are carried out, except that the etching of the steps of FIGS. 5A and 5B crosses buried insulating layer 45.

Advantageously, the methods discussed herein enable to form, at the surface of a same substrate, strained-channel transistors and unstrained channel transistors. To achieve this, the method described herein will be carried out after having masked all the transistors which should not have a strained channel.

Further, advantageously, the step of etching the sacrificial layer shown in FIGS. 4A and 4B is a step currently used to form, on a same substrate, insulated MOS transistor gates of different materials, for example, with an insulating layer made of a material of strong or low dielectric constant or having a conductive layer formed of a stack of several materials, for example.

Further, the fact for the source and drain regions of the transistors to be formed prior to the forming of final insulated gates 12 enables to avoid for these insulated gates to be submitted to too strong a thermal processing. Indeed, the source and drain regions of the transistors are generally formed by applying strong thermal processings, that is, a high temperature, to the structure. The method discussed herein thus enables forming transistor gates made of materials which cannot stand strong thermal stress.

The method discussed herein thus enables to obtain, at the surface of a same substrate, various types of MOS transistors having channels ensuring an optimum mobility of the carriers traveling through them. This method has the advantage of only requiring two additional steps with respect to conventional methods of replacement of a sacrificial insulated gate with a new gate, that is, the step of etching of trenches 42, which may be carried out at the same time as the step of suppression of insulating portion 32 of the sacrificial gate if the etching is compatible, and the step of filling of these cavities.

Specific embodiments of the present invention have been described. Various alterations and modifications will occur to those skilled in the art. In particular, the various etch and deposition steps may be carried out by any known method. Further, according to the considered type of carriers and to the semiconductor channel material, it will be within the abilities of those skilled in the art to determine the material to be formed in regions 24 so that a strain capable of optimizing the carrier mobility is applied on the channel.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a strained channel MOS transistor, comprising the steps of:
    (a) forming, at a surface of a semiconductor substrate, a MOS transistor comprising source and drain regions and an insulated sacrificial gate which partly extends over insulation structures, wherein the insulation structures extend into the semiconductor substrate and surround the transistor;
    (b) forming a layer of a dielectric material having its upper surface level with the upper surface of the sacrificial gate;
    (c) removing the sacrificial gate;
    (d) etching at least an upper portion of the exposed insulation structures to form trenches therein extending below the surface of the semiconductor substrate;
    (e) filling the trenches with a material capable of straining the substrate; and
    (f) forming, in the space left free by the sacrificial gate, an insulated MOS transistor gate.

2. The method of claim 1, wherein step (e) is carried out by depositing a material capable of straining the substrate over the entire structure, and by then etching the excess material located outside of the trenches.

3. The method of claim 1, wherein the trenches extend all the way to the semiconductor substrate, or all the way to a semiconductor-on-insulator structure support, and the filling of the trenches at step (e) is performed by epitaxy of the material capable of applying a strain from the bottom of the trenches.

4. The method of claim 1, wherein the substrate is a solid substrate.

5. The method of claim 1, wherein the substrate is a substrate of semiconductor-on-insulator type.

6. The method of claim 1, wherein the material capable of straining the substrate is silicon nitride, silicon-germanium, or a material having a structure capable of reflowing after an anneal.

7. The method of claim 1, wherein step (f) is preceded or followed by a step of removal of the dielectric material layer.

8. An integrated circuit comprising at least one MOS transistor formed by the method of claim 1.

9. The method of claim 1, wherein steps (a) through (f) are performed successively.

10. A method for manufacturing a strained-channel MOS transistor comprising:
    fabricating, at a surface of a substrate, a MOS transistor comprising an insulated sacrificial gate that extends partly over insulation structures adjacent the MOS transistor at the surface of the substrate, wherein the insulation structures extend into the substrate;
    removing the sacrificial gate;

etching at least a portion of the insulation structures exposed by the removal of the sacrificial gate to form trenches extending into the insulation structures below the surface of the substrate; and filling the trenches with a straining material selected to strain a channel area of the MOS transistor.

11. The method of claim 10, further comprising forming a dielectric layer having its upper surface level with an upper surface of the sacrificial gate.

12. The method of claim 10, wherein the insulation structures are deposited before a gate insulator is formed for the insulated sacrificial gate.

13. The method of claim 12, further comprising etching the insulating structures so that the formed trenches extend all the way through the insulating structures to the substrate.

14. The method of claim 10, wherein the substrate is a solid semiconductor substrate.

15. The method of claim 10, wherein the substrate is a semiconductor-on-insulator substrate.

16. The method of claim 10, further comprising annealing the straining material to reflow the straining material.

17. The method of claim 10, further comprising forming, in the region vacated by the removed sacrificial gate, an insulated MOS gate.

* * * * *

UNITED STATES PATENT AND TRADEMARK OFFICE
CERTIFICATE OF CORRECTION

PATENT NO. : 8,530,292 B2
APPLICATION NO. : 13/229081
DATED : September 10, 2013
INVENTOR(S) : Yves Morand et al.

It is certified that error appears in the above-identified patent and that said Letters Patent is hereby corrected as shown below:

In the Specification

Col. 3, line 44, should read:
be provided to form strained-channel and unstrained-channel Column 4, line 6, should read:
forming insulation regions 36, is formed on the structure to Signed and Sealed this
Twenty-ninth Day of October, 2013

Teresa Stanek Rea
*Deputy Director of the United States Patent and Trademark Office*